(12) United States Patent
Huang et al.

(10) Patent No.: US 8,724,762 B2
(45) Date of Patent: May 13, 2014

(54) CLOCK REGENERATION METHOD, REFERENCE-LESS RECEIVER, AND CRYSTAL-LESS SYSTEM

(75) Inventors: Yen-Yin Huang, Taoyuan County (TW);
Chauo-Min Chen, Kaohsiung (TW);
Kuan-Yu Chen, Hualien County (TW);
Yu-Sheng Yi, Hsinchu (TW);
Ming-Shih Yu, New Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 443 days.

(21) Appl. No.: 13/175,884

(22) Filed: Jul. 4, 2011

(65) Prior Publication Data

US 2013/0010909 A1 Jan. 10, 2013

(51) Int. Cl.
*H04L 7/00* (2006.01)
(52) U.S. Cl.
USPC ............ 375/368; 375/219; 375/295; 375/316
(58) Field of Classification Search
CPC .... H04L 7/033; H04L 7/04; H04L 2012/5674
USPC .................................. 375/365, 368
See application file for complete search history.

(56) References Cited

U.S. PATENT DOCUMENTS

| 6,407,641 | B1 | 6/2002 | Williams |
| 6,762,635 | B2 | 7/2004 | Bruhnke |
| 6,771,726 | B2 | 8/2004 | Pomet |
| 7,324,619 | B2 | 1/2008 | Tsai |
| 7,541,877 | B2 | 6/2009 | Yang |
| 7,567,108 | B2 | 7/2009 | Tang |
| 7,633,348 | B2 | 12/2009 | Lin |
| 7,760,837 | B2 * | 7/2010 | Kanazashi ..................... 375/368 |
| 2007/0079166 | A1 | 4/2007 | Okada |
| 2007/0174727 | A1 | 7/2007 | Liao |
| 2011/0182390 | A1 * | 7/2011 | Lin et al. ....................... 375/371 |

* cited by examiner

*Primary Examiner* — Shuwang Liu
*Assistant Examiner* — David Huang
(74) *Attorney, Agent, or Firm* — Winston Hsu; Scott Margo

(57) ABSTRACT

A clock regeneration method, for generating a clock signal for being utilized by a receiver/transceiver/receiver system/transceiver system, includes: performing data/pattern detection on at least one input signal to generate recovered data; detecting at least one synchronization pattern in the input signal according to a synchronization pattern rule, and generating a synchronization signal corresponding to the synchronization pattern; and performing frequency-locking on the synchronization signal to generate the clock signal. More particularly, the step of detecting the at least one synchronization pattern in the input signal according to the synchronization pattern rule further comprises: detecting the at least one synchronization pattern by performing synchronization pattern detection on the recovered data. An associated reference-less receiver and an associated crystal-less system are also provided.

18 Claims, 17 Drawing Sheets

CLOCK REGENERATION METHOD, REFERENCE-LESS RECEIVER, AND CRYSTAL-LESS SYSTEM

BACKGROUND OF THE INVENTION

1. Field of the Invention

The present invention relates to Universal Serial Bus (USB) communication, and more particularly, to a clock regeneration method, an associated reference-less receiver, and an associated crystal-less system.

2. Description of the Prior Art

Typically, the conventional receiver needs an external crystal oscillator, so the architecture thereof is complicated. More particularly, the external crystal oscillator is utilized as a source of a reference frequency, various problems may occur. For example, when the conventional receiver utilizes the external crystal oscillator as the source of the reference frequency, additional terminals and associated Electrostatic Discharge (ESD) protection circuits are needed, and therefore, additional costs are introduced. In addition, regarding the problems of the power consumption of the external crystal oscillator and switching noises, it seems unlikely that there is a good solution in the related art. Additionally, a limitation of the thickness may exist in some applications. For example, the thickness of a chip within a chip card may not exceed 800 micrometers, which is much less than a typical width of the outer shell of the external crystal oscillator, so the external crystal oscillator is not suitable for these applications.

In response to the above problems, some solutions are proposed in the related art. However, some side effects may be introduced. For example, according to the related art, inductance-capacitance oscillators (LC OSCs), resistance-capacitance oscillator (RC OSCs), band-gap reference circuits, and/or passive components are required, causing the process to be complicated and causing the overall cost to be increased. Therefore, a novel method is required for clock regeneration, in order to achieve the best receiver performance without introducing the side effects mentioned above, having no need to utilize any external crystal oscillator.

SUMMARY OF THE INVENTION

It is therefore an objective of the claimed invention to provide a clock regeneration method, an associated reference-less receiver, and an associated crystal-less system, in order to solve the above-mentioned problems.

It is another objective of the claimed invention to provide a clock regeneration method, an associated reference-less receiver, and an associated crystal-less system, in order to achieve the best receiver performance without introducing the side effects mentioned above, having no need to utilize any external crystal oscillator.

It is another objective of the claimed invention to provide a clock regeneration method, an associated reference-less receiver, and an associated crystal-less system, in order to enhance the transmission performance. Even in a situation where the initial frequency error such as a frequency difference between the respective frequencies of the two ends of a transmission channel is greater than as usual, the architecture implemented according to the present invention can still properly perform receiving operations.

According to a preferred embodiment of the claimed invention, a clock regeneration method is provided, wherein the clock regeneration method is utilized for generating a clock signal for being utilized by a receiver/transceiver/receiver system/transceiver system. The clock regeneration method comprises: performing data/pattern detection on at least one input signal to generate recovered data; detecting at least one synchronization pattern in the input signal according to a synchronization pattern rule, and generating a synchronization signal corresponding to the synchronization pattern; and performing frequency-locking on the synchronization signal to generate the clock signal. More particularly, the step of detecting the at least one synchronization pattern in the input signal according to the synchronization pattern rule further comprises: detecting the at least one synchronization pattern by performing synchronization pattern detection on the recovered data.

According to a preferred embodiment of the claimed invention, a reference-less receiver is provided, wherein the reference-less receiver is utilized for performing data/pattern detection on at least one input signal to generate recovered data. The reference-less receiver comprises: a digitalization circuit, a bit transition detection unit, a unit-time detection unit, and a data/pattern decoder. The digitalization circuit is arranged to perform digitalization operations on the input signal, in order to detect logical values represented by the input signal at a plurality of time points, respectively, wherein a length between any two adjacent time points of the plurality of time points is equivalent to a predetermined delay amount. The bit transition detection unit is arranged to perform bit transition detection operations according to the logical values, in order to generate bit transition detection results. In addition, the unit-time detection unit is arranged to analyze at least one portion of the logical values by utilizing the bit transition detection results, in order to dynamically determine/update a unit bit length, wherein the unit bit length is a multiple that is measured by utilizing the predetermined delay amount as a measurement unit. Additionally, the data/pattern decoder is arranged to convert the logical values into the recovered data according to the unit bit length.

While the clock regeneration method mentioned above is disclosed, a crystal-less system is further provided, wherein the crystal-less system is utilized for generating a clock signal for being utilized by a receiver/transceiver/receiver system/transceiver system. The crystal-less system comprises: a data/pattern detection module, a synchronization pattern detection module, and a frequency-locking device, wherein the frequency-locking device comprises at least one hardware circuit. The data/pattern detection module is arranged to perform data/pattern detection on at least one input signal to generate recovered data. In addition, the synchronization pattern detection module is arranged to detect at least one synchronization pattern in the input signal according to a synchronization pattern rule, and generate a synchronization signal corresponding to the synchronization pattern. Additionally, the frequency-locking device is arranged to perform frequency-locking on the synchronization signal to generate the clock signal. More particularly, the synchronization pattern detection module detects the at least one synchronization pattern by performing synchronization pattern detection on the recovered data.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
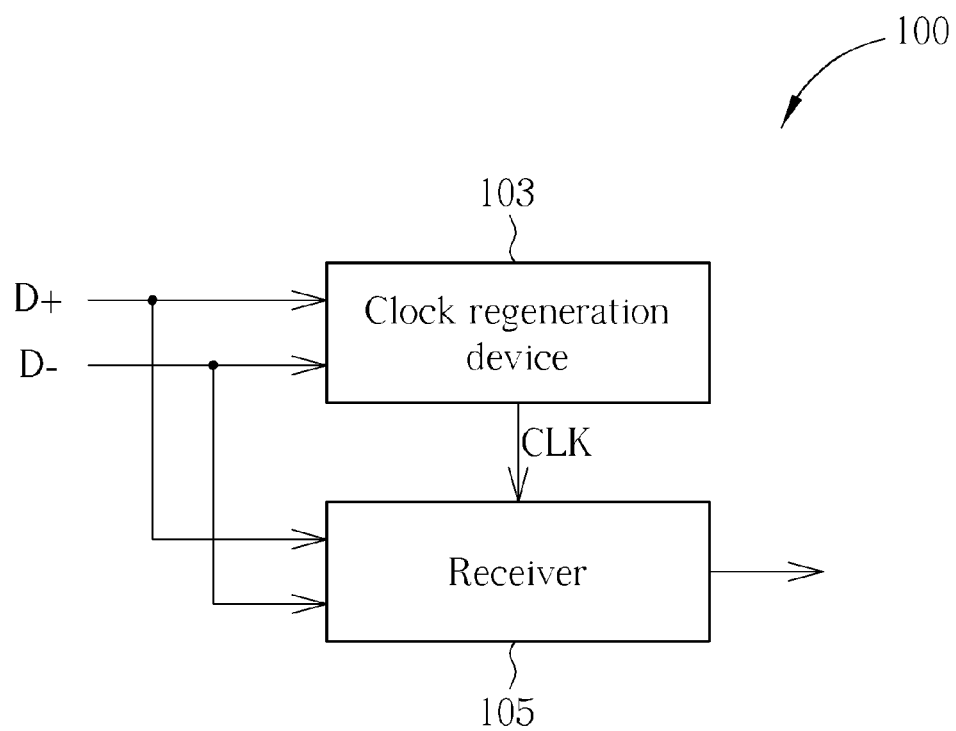
FIG. 1A is a diagram of a crystal-less system according to a first embodiment of the present invention.

Please refer to FIG. 1A. FIG. 1A is a diagram of a crystal-less system 100 according to a first embodiment of the present invention. According to this embodiment, the crystal-less system 100 can be applied to various devices respectively complying with Universal Serial Bus (USB) 1.0, 1.1, and 2.0 standards, such as various kinds of portable electronic devices. As shown in FIG. 1A, the crystal-less system 100 comprises a clock regeneration device 103 and a receiver 105. Without introducing the side effects mentioned above, having no need to utilize any external crystal oscillator, the clock regeneration device 103 can generate the clock signal CLK of extremely high accuracy according to at least one input signal such as the input signals D+ and D− (which are a set of differential signals in this embodiment), for being utilized by the receiver 105. As a result, the crystal-less system 100 can achieve the best receiver performance by utilizing the clock signal CLK.

Figure 1B:
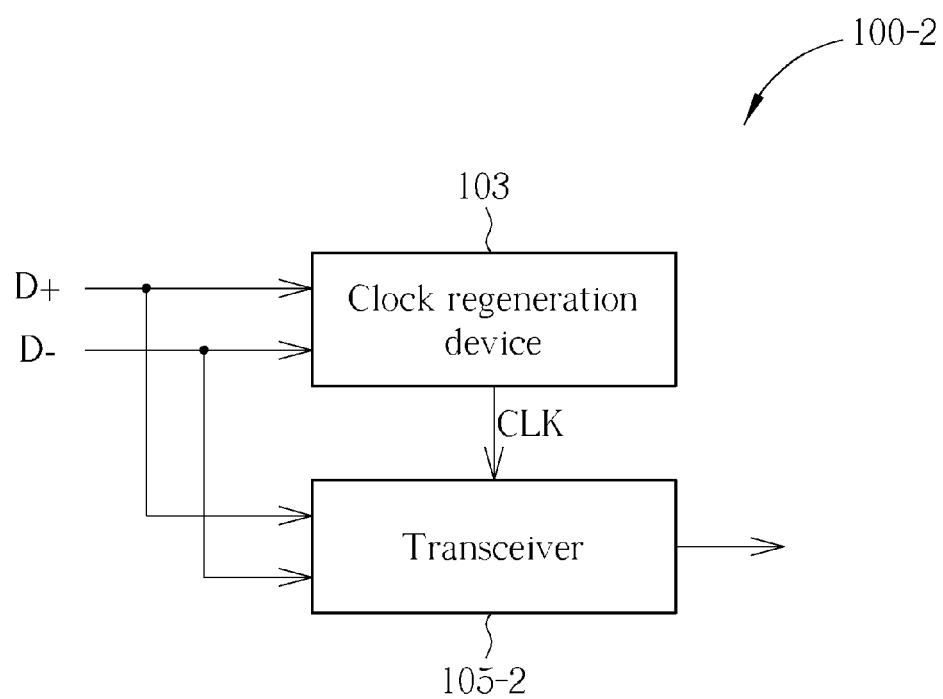
FIG. 1B is a diagram of a crystal-less system according to a second embodiment of the present invention.
Figure 1C:
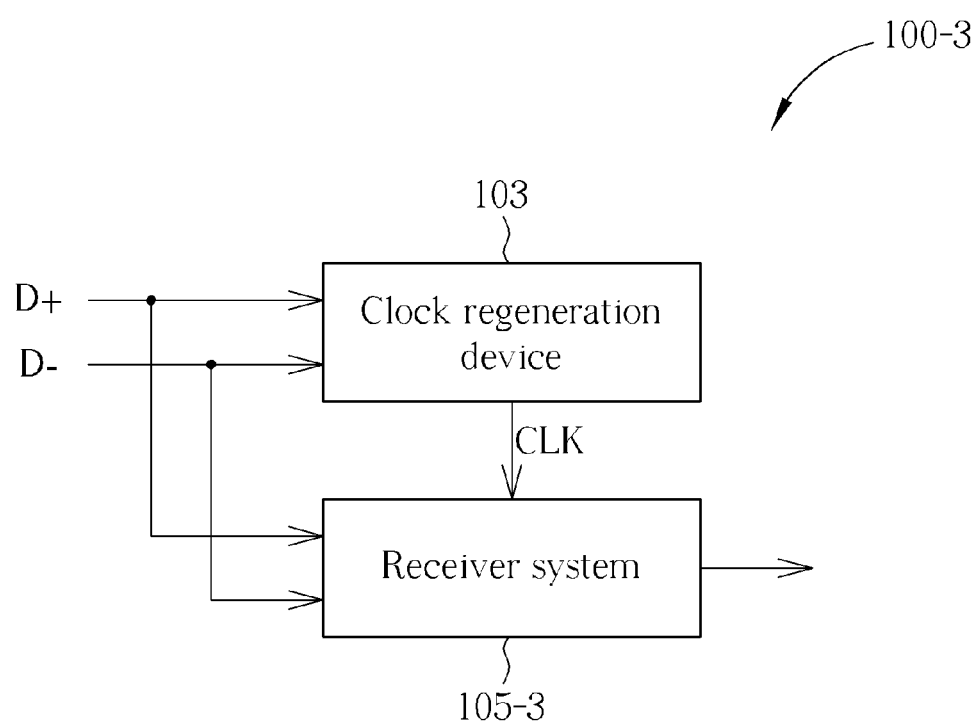
FIG. 1C is a diagram of a crystal-less system according to a third embodiment of the present invention.
Figure 1D:
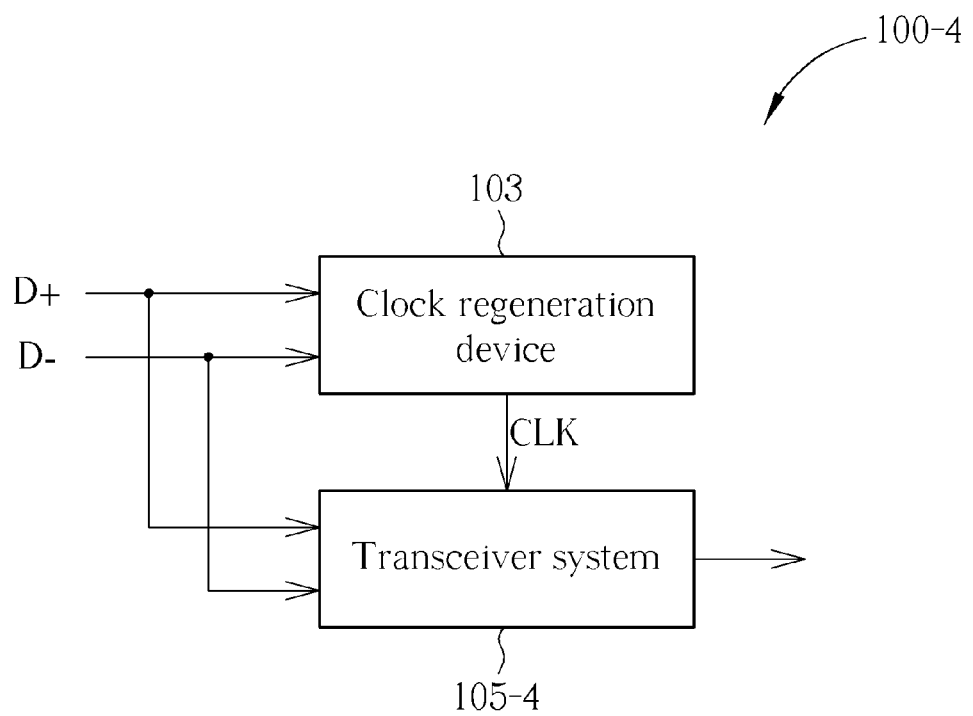
FIG. 1D is a diagram of a crystal-less system according to a fourth embodiment of the present invention.

In this embodiment, the receiver 105 is taken as an example of the component that achieves the best performance by utilizing the clock signal CLK. This is for illustrative purposes only, and is not meant to be a limitation of the present invention. According to different variations of this embodiment, the aforementioned receiver 105 can be replaced by a transceiver, a receiver system, or a transceiver system. In one of these variations, such as the second embodiment shown in FIG. 1B, the aforementioned receiver 105 is replaced by a transceiver 105-2, and in response to the change in architecture, the numeral 100 is replaced by 100-2. In another of these variations, such as the third embodiment shown in FIG. 1C, the aforementioned receiver 105 is replaced by a receiver system 105-3, and in response to the change in architecture, the numeral 100 is replaced by 100-3. In another of these variations, such as the fourth embodiment shown in FIG. 1D, the aforementioned receiver 105 is replaced by a transceiver system 105-4, and in response to the change in architecture, the numeral 100 is replaced by 100-4.

Figure 1E:
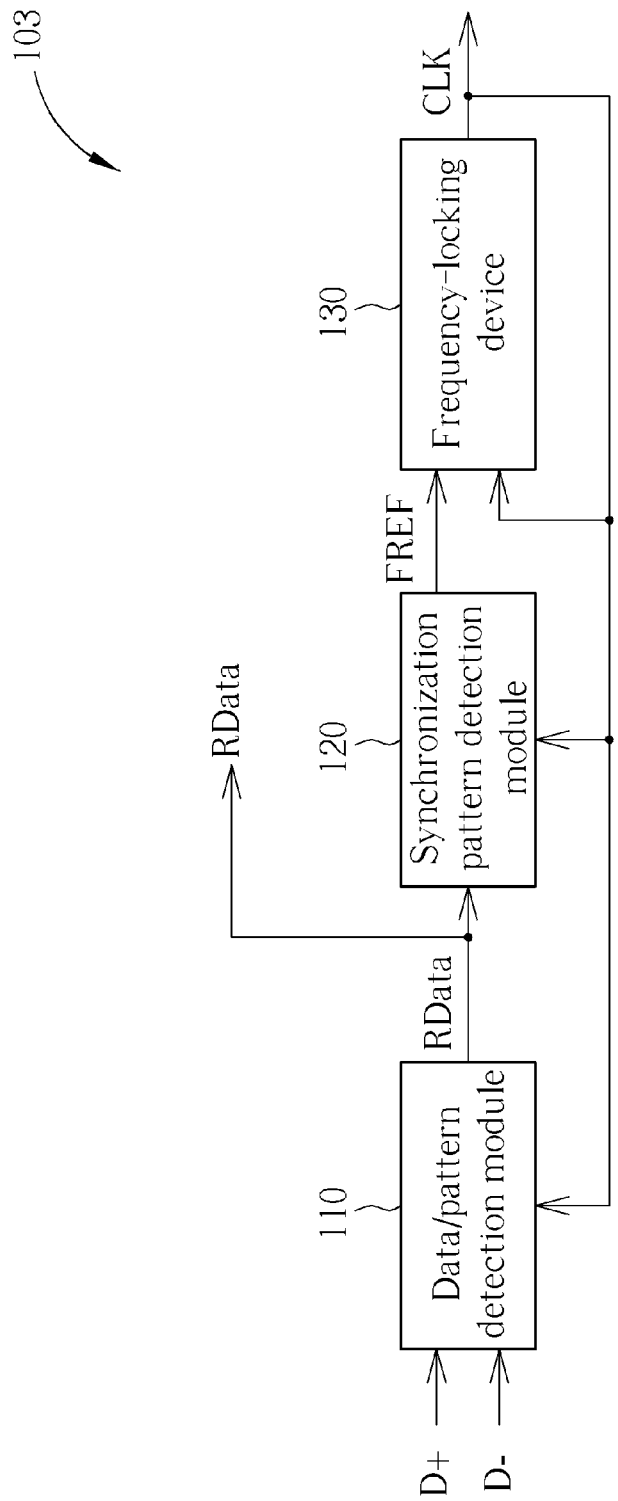
FIG. 1E illustrates some implementation details of the clock regeneration device shown in any of FIGS. 1A-1D according to an embodiment of the present invention.

FIG. 1E illustrates some implementation details of the clock regeneration device 103 shown in any of FIGS. 1A-1D according to an embodiment of the present invention. As shown in FIG. 1E, the clock regeneration device 103 in any of the crystal-less system 100, the crystal-less system 100-2, the crystal-less system 100-3, and the crystal-less system 100-4 disclosed above comprises a data/pattern detection module 110, a synchronization pattern detection module 120, and a frequency-locking device 130, where the frequency-locking device 130 comprises at least one hardware circuit. The data/pattern detection module 110 is arranged to perform data/pattern detection on at least one input signal such as the input signal D+ and D− to generate recovered data RData. In addition, the synchronization pattern detection module 120 is arranged to detect at least one synchronization pattern in the input signal according to a synchronization pattern rule, and generate a synchronization signal FREF corresponding to the synchronization pattern, and the frequency-locking device 130 is arranged to perform frequency-locking on the synchronization signal FREF to generate the clock signal CLK, where the synchronization pattern rule of this embodiment corresponds to the synchronization signal definition of the USB standards. This is for illustrative purposes only, and is not meant to be a limitation of the present invention. According to different variations of this embodiment, the aforementioned synchronization pattern rule can be varied. For example, according to the synchronization signal definition of some standard(s), a synchronization packet comprising a synchronization pattern occurs in the aforementioned input signal every $T_{SYNC0}$ microseconds, and the synchronization pattern detection module 120 detects at least one synchronization packet in the input signal according to the corresponding synchronization pattern rule, and generates the synchronization signal FREF corresponding to the synchronization packet, where a period of the synchronization signal FREF is $T_{SYNC0}$ microseconds. In another example, according to the synchronization signal definition of some standard(s), a certain synchronization pattern occurs in the aforementioned input signal every $T_{SYNC1}$ microseconds, and the synchronization pattern detection module 120 detects at least one synchronization pattern in the input signal according to the corresponding synchronization pattern rule, and generates the synchronization signal FREF corresponding to the synchronization pattern, where a period of the synchronization signal FREF is $T_{SYNC1}$ microseconds.

According to the embodiment shown in FIG. 1E, the synchronization pattern detection module 120 is arranged to detect the aforementioned at least one synchronization pattern by performing synchronization pattern detection on the recovered data RData.

Figure 1F:
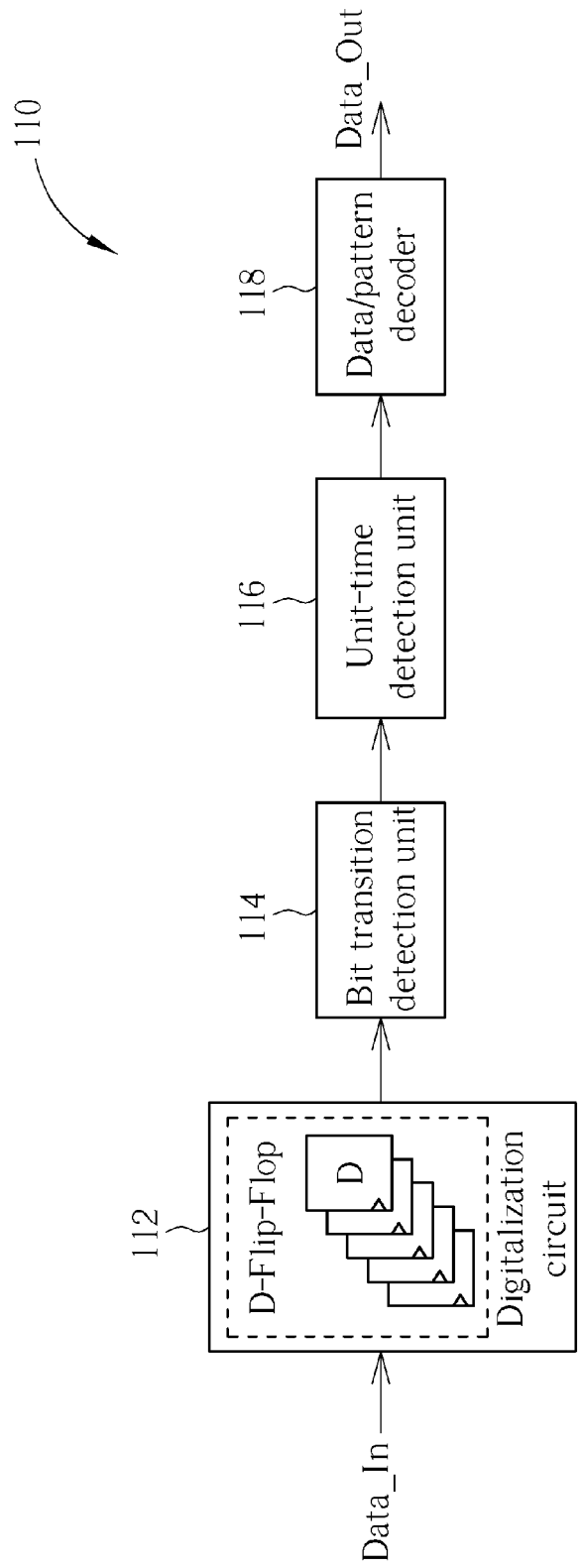
FIG. 1F illustrates some implementation details of the data/pattern detection module shown in FIG. 1E according to an embodiment of the present invention.

FIG. 1F illustrates some implementation details of the data/pattern detection module 110 shown in FIG. 1E according to an embodiment of the present invention. As shown in FIG. 1F, the data/pattern detection module 110 comprises a digitalization circuit 112, a bit transition detection unit 114, a unit-time detection unit 116, and a data/pattern decoder 118, where the digitalization circuit 112 of this embodiment comprises a plurality of D-Flip-Flops. For simplicity, the D-Flip-Flops are labeled with the notation "D" in FIG. 1F. In addition, the notation Data_In represents the aforementioned at least one input signal (For example, the input signals D+ and D−), and the notation Data_Out represents the aforementioned recovered data RData.

According to this embodiment, the digitalization circuit 112 is arranged to perform digitalization operations on the input signal Data_In, in order to detect logical values represented by the input signal Data_In at a plurality of time points, respectively. The bit transition detection unit 114 is arranged to perform bit transition detection operations according to the logical values, in order to generate bit transition detection results. In addition, the unit-time detection unit 116 is arranged to analyze at least one portion of the logical values by utilizing the bit transition detection results, in order to dynamically determine/update a unit bit length. Additionally, the data/pattern decoder 118 is arranged to convert the logical values into the recovered data Data_Out (or the recovered data RData) according to the unit bit length.

According to some embodiments of the present invention, the data/pattern detection module 110 shown in FIG. 1F can be utilized as a reference-less receiver, where the recovered data RData is utilized as the output of the reference-less receiver. In this situation, the receiver 105 shown in FIG. 1A (or the transceiver 105-2, the receiver system 105-3, or the transceiver system 105-4 mentioned above) can be replaced by a transmitter or a transmitter system. Please note that, although the accuracy of the reference-less receiver in these embodiments may be lower than that of the receiver 105 in the embodiment shown in FIG. 1A, the architecture shown in FIG. 1F can save costs since the architecture is simple and compact. Therefore, the architecture shown in FIG. 1F is especially suitable for cost-sensitive products such as mice, keyboards, and toys.

Figure 2:
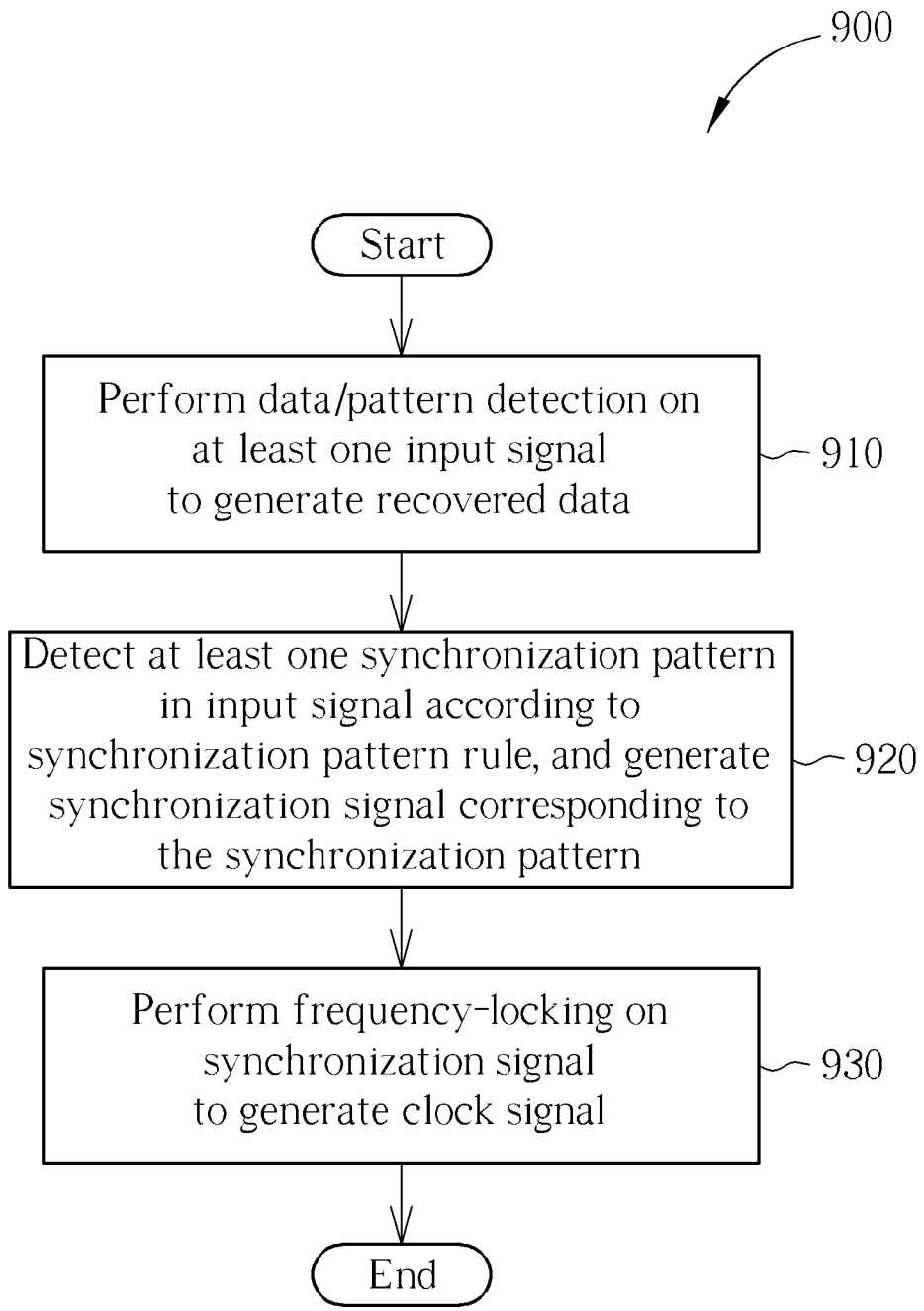
FIG. 2 is a flowchart of a clock regeneration method according to an embodiment of the present invention.

FIG. 2 is a flowchart of a clock regeneration method 900 according to an embodiment of the present invention. The clock regeneration method 900 can be applied to any of the crystal-less system 100, the crystal-less system 100-2, the crystal-less system 100-3, and the crystal-less system 100-4 in the embodiments/variations disclosed above. In addition, the clock regeneration method 900 can be implemented by utilizing any of the crystal-less system 100 shown in FIG. 1A, the crystal-less system 100-2 shown in FIG. 1B, the crystal-less system 100-3 shown in FIG. 1C, the crystal-less system 100-4 shown in FIG. 1D, the clock regeneration device 103 shown in FIG. 1E, and the data/pattern detection module 110 shown in FIG. 1F. The clock regeneration method 900 is described as follows.

In Step 910, the data/pattern detection module 110 performs data/pattern detection on the aforementioned at least one input signal such as the input signal D+ and D− to generate the recovered data RData. In practice, the data/pattern detection module 110 can perform data/pattern detection by utilizing digitalization operations performed on the input signal along the time axis, and more particularly, perform high-resolution sampling operations along the time axis, such as oversampling operations and/or sampling operations utilizing multi-phase clocks.

In Step 920, the synchronization pattern detection module 120 detects at least one synchronization pattern in the input signal according to a synchronization pattern rule such as the aforementioned synchronization pattern rule, and generates the synchronization signal FREF corresponding to the synchronization pattern. More particularly, the synchronization pattern detection module 120 can detect the aforementioned at least one synchronization pattern by performing synchronization pattern detection on the recovered data RData. In practice, the synchronization pattern rule corresponds to the synchronization signal definition of some communication standard(s) such as any of USB 1.0, 1.1, and 2.0 standards.

In Step 930, the frequency-locking device 130 performs frequency-locking on the synchronization signal FREF to generate the clock signal CLK. More particularly, the frequency-locking device 130 can utilize a Digitally Controlled Oscillator (DCO) to generate an initial version of the clock signal CLK. For example, the frequency-locking device 130 can utilize the output of the DCO as the clock signal CLK. In another example, the frequency-locking device 130 can utilize a derivative signal of the output of the DCO as the clock signal CLK. According to this embodiment, no matter whether the frequency-locking device 130 utilizes the output of the DCO as the clock signal CLK or utilizes the derivative signal of the output of the DCO as the clock signal CLK, the frequency-locking device 130 can detect a frequency difference/phase difference between the clock signal CLK and the synchronization signal FREF, and dynamically adjust the frequency of the clock signal CLK according to the frequency difference/phase difference, in order to lock the frequency of the clock signal CLK onto a multiple of the frequency of the synchronization signal FREF or a multiple of a rational.

In practice, at least one portion of the respective operations disclosed in Step 910, Step 920, and Step 930 can be performed at the same time, in order to achieve the best performance. For example, after a portion of the operations of Step 910 is performed, the synchronization pattern detection module 120 can start to perform the operations of Step 920. In another example, after a portion of the operations of Step 920 is performed, the frequency-locking device 130 can start to perform the operations of Step 930. In addition, the respective operations disclosed in Step 910, Step 920, and Step 930 can be performed repeatedly.

Figure 3A:
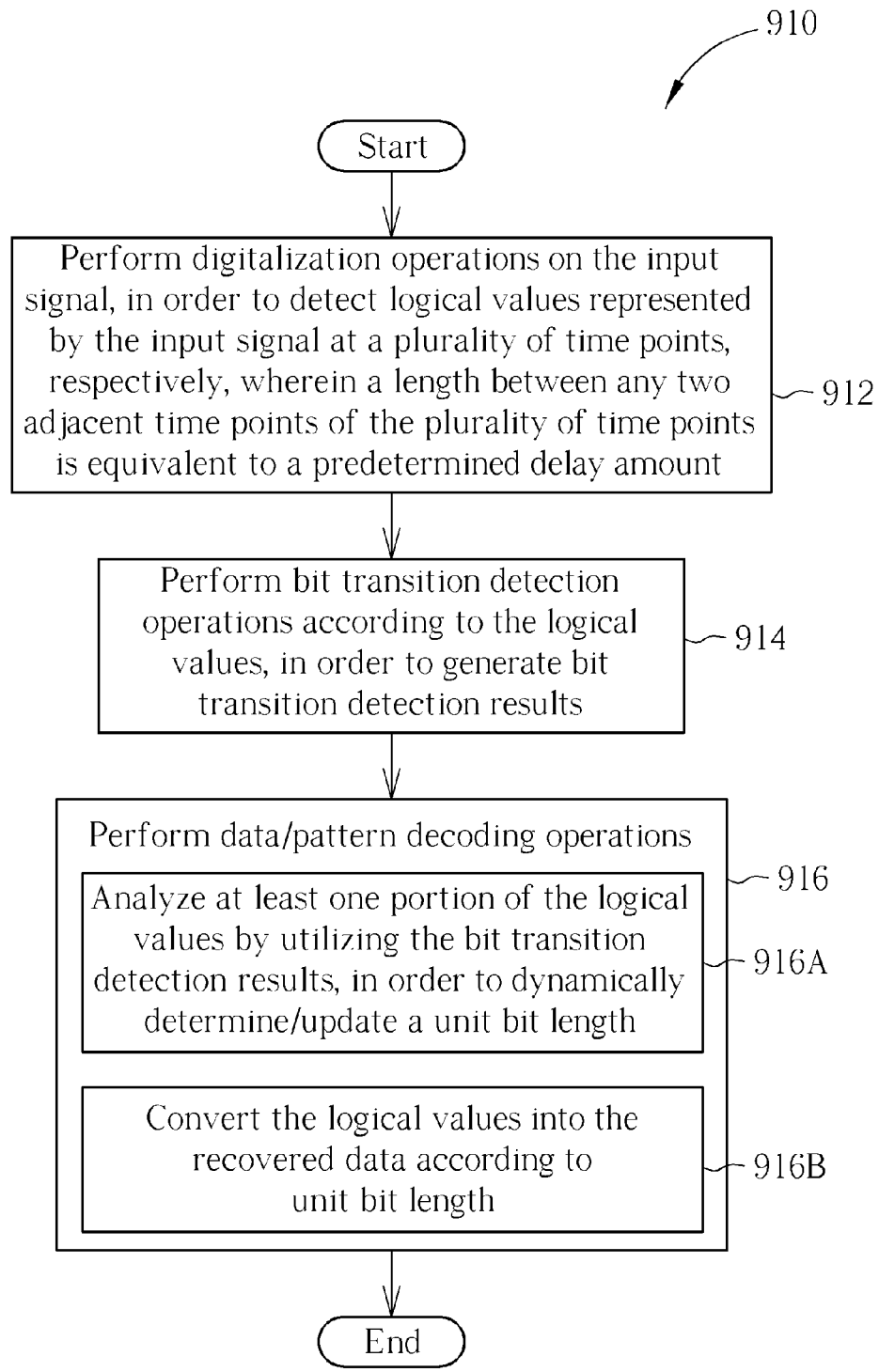
FIGS. 3A-3C illustrate some implementation details of the clock regeneration method shown in FIG. 2 according to an embodiment of the present invention.
Figure 3B:
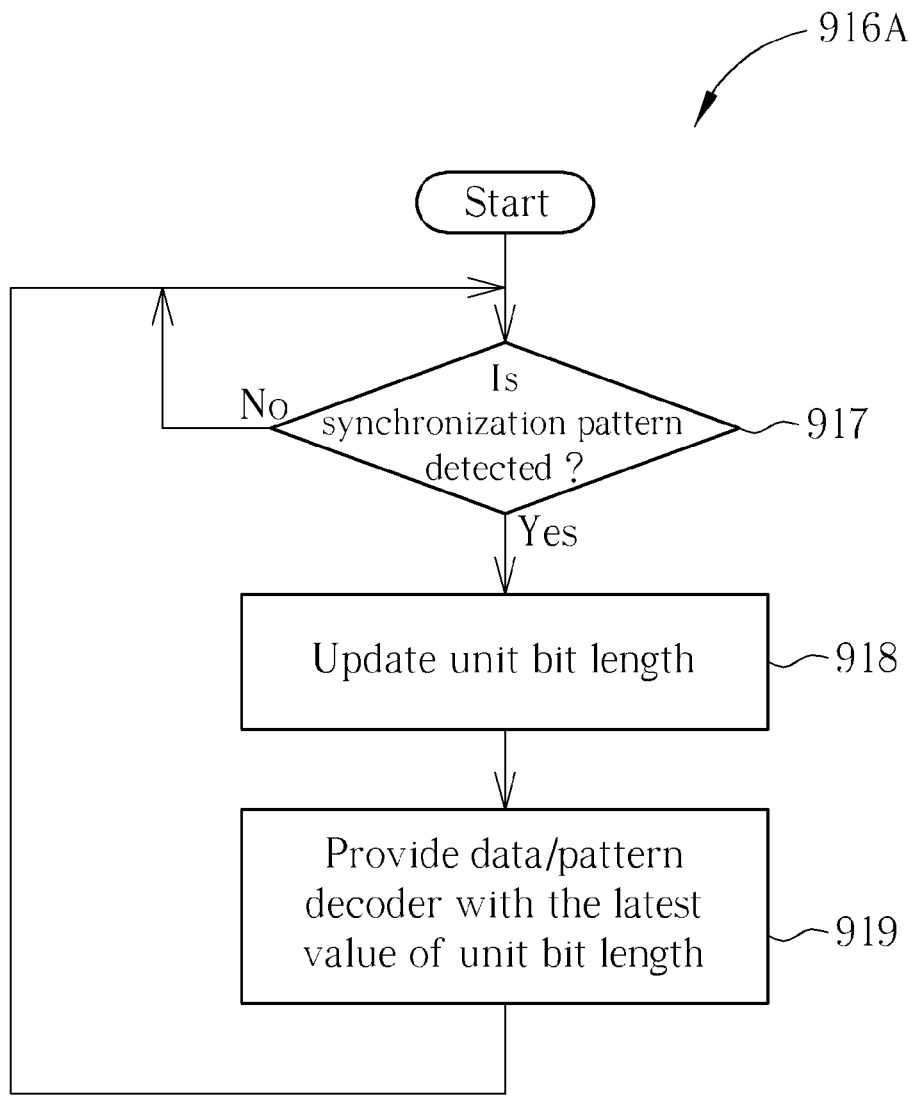
Figure 3C:
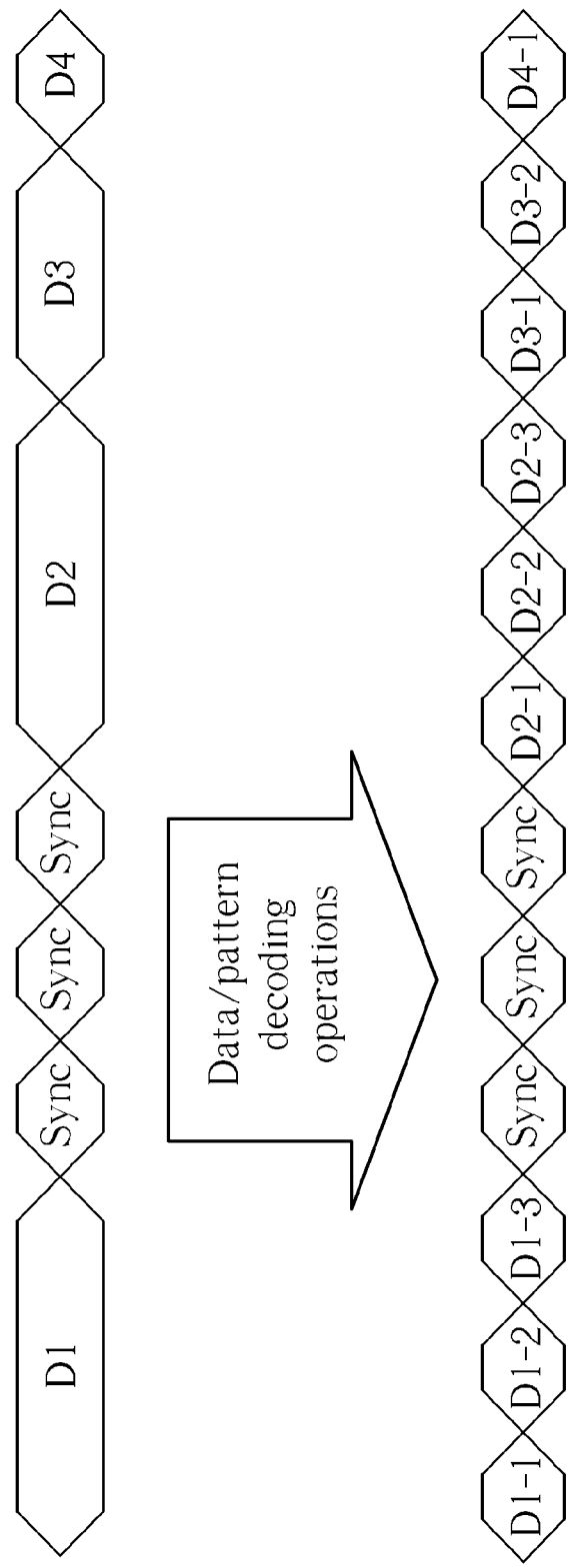

FIGS. 3A-3C illustrate some implementation details of the clock regeneration method 900 shown in FIG. 2 according to an embodiment of the present invention.

Please refer to FIG. 3A. In Step 912, the digitalization circuit 112 performs digitalization operations on the aforementioned at least one input signal Data_In, in order to detect the logical values represented by the input signal Data_In at a plurality of time points such as the time points mentioned above, respectively, where a length between any two adjacent time points of the plurality of time points is equivalent to a predetermined delay amount. In practice, the predetermined delay amount is less than the length of any bit of data carried by the input signal Data_In along the time axis.

In Step 914, the bit transition detection unit 114 performs bit transition detection operations according to the logical values, in order to generate bit transition detection results, where the bit transition detection results represent logical value variations between some adjacent bits.

In Step 916, the unit-time detection unit 116 and the data/pattern decoder 118 perform data/pattern decoding operations. As shown in FIG. 3A, Step 916 comprises the operations of Step 916A and Step 916B. According to this embodiment, at least one portion of the respective operations disclosed in Step 916A and Step 916B can be performed at the same time, in order to achieve the best performance. More particularly, the operations of Step 916A and Step 916B can be performed in a parallel manner.

In Step 916A, the unit-time detection unit 116 analyzes at least one portion of the logical values by utilizing the bit transition detection results, in order to dynamically determine/update the aforementioned unit bit length, where the unit bit length is a multiple that is measured by utilizing the predetermined delay amount as a measurement unit. More particularly, the unit-time detection unit 116 finds a minimum of the respective numbers of different sets of continuously detected non-transition logical values (e.g. the continuously detected logical values $\{0, 0, \ldots, 0\}$, or the continuously detected logical values $\{1, 1, \ldots, 1\}$) within the logical values, and utilizes the minimum as the latest value of the unit bit length.

In Step 916B, the data/pattern decoder 118 converts the logical values into the recovered data Data_Out (i.e. the recovered data RData shown in FIG. 1E) according to the unit bit length. More particularly, within the logical values, the data/pattern decoder 118 dynamically determines a set of continuously detected logical values corresponding to a bit according to the unit bit length, and keeps a logical value of the set of continuously detected logical values as that of the bit within the recovered data Data_Out. For example, the logical value can be any of the set of continuously detected logical values, where the data/pattern decoder 118 determines a group of continuously detected same logical values to be the set of continuously detected logical values. In another example, the logical value can be a mode of the set of continuously detected logical values (i.e. the value that occurs most frequently in the set of continuously detected logical values, based upon the definition in statistics), where the data/pattern decoder 118 can exclude abnormal logical values due to noise, such as a single logical value between two groups of continuously detected non-transition logical values (e.g. the single logical value 1 within the logical values $\{\{0, 0, \ldots, 0\}, 1, \{0, 0, \ldots, 0\}\}$, or the single logical value 0 within the logical values $\{\{1, 1, \ldots, 1\}, 0, \{1, 1, \ldots, 1\}\}$).

In practice, at least one portion of the respective operations disclosed in Step 912, Step 914, and Step 916 can be performed at the same time, in order to achieve the best performance. For example, after a portion of the operations of Step 912 is performed, the bit transition detection unit 114 can start to perform the operations of Step 914. In another example, after a portion of the operations of Step 914 is performed, the unit-time detection unit 116 and the data/pattern decoder 118 can start to perform the operations of Step 916, and more particularly, perform the operations of Step 916A and Step 916B, respectively. In addition, the respective operations disclosed in Step 912, Step 914, and Step 916 can be performed repeatedly.

According to the synchronization signal definition of some standard(s), the aforementioned input signal Data_In carries a certain synchronization pattern during data transmission. The unit-time detection unit 116 of this embodiment can update the aforementioned unit bit length according to the synchronization pattern. Referring to FIG. 3B, related details thereof are described as follows.

In Step 917, the unit-time detection unit 116 checks whether the synchronization pattern is detected. When the synchronization pattern is detected, Step 918 is entered; otherwise, Step 917 is re-entered.

In Step 918, the unit-time detection unit 116 updates the unit bit length. More particularly, the unit-time detection unit 116 can analyze the bits {Sync} corresponding to the synchronization pattern within the logical values by utilizing the bit transition detection results mentioned in Step 914, in order to dynamically determine the unit bit length, and update the unit bit length stored in a register. For example, in a situation where a synchronization pattern 010 is detected, the unit-time detection unit 116 can analyze the respective bits {0, 1, 0} of the synchronization pattern 010, and find the minimum $N_{Sync\_Min}$ of the respective numbers $\{N_{Sync}\}$ of different sets of logical values respectively corresponding to the respective bits {0, 1, 0}, and utilize the minimum $N_{Sync\_Min}$ as the latest value of the unit bit length. According to different embodiments, such as the embodiment shown in FIG. 3B or some variations thereof, the register can be positioned within the unit-time detection unit 116, within the data/pattern detection module 110, or within the clock regeneration device 103.

In Step 919, the unit-time detection unit 116 provides the data/pattern decoder 118 with the latest value of the unit bit length.

In practice, at least one portion of the respective operations disclosed in Step 917, Step 918, and Step 919 can be performed at the same time, in order to achieve the best performance. For example, after a portion of the operations of Step 917 is performed, as long as the data/pattern decoder 118 needs the unit bit length, the unit-time detection unit 116 can start to perform the operations of Step 919. In another example, when Step 918 is entered, before the unit bit length is updated, as long as the data/pattern decoder 118 needs the unit bit length, the unit-time detection unit 116 can start to perform the operations of Step 919.

As shown in FIG. 3C, by utilizing the data/pattern decoding operations of Step 916, the data/pattern detection module 110 can decode the data D1, D2, D3, and D4 carried by the input signal Data_In to generate the respective bits {D1-1, D1-2, D1-3}, {D2-1, D2-2, D2-3}, {D3-1, D3-2}, and {D4-1} thereof, respectively, where each of {D1-1, D1-2, D1-3, D2-1, D2-2, D2-3, D3-1, D3-2, D4-1} is a bit of data. For example, the unit-time detection unit 116 performs the analyzing operations disclosed in Step 916A to determine that the unit bit length is eight times the predetermined delay amount, which means the unit-time detection unit 116 determines that each of the respective lengths of the respective bits {Sync} of the synchronization pattern is equivalent to eight times the predetermined delay amount along the time axis. In a situation where the data/pattern decoder 118 determines that the length of the data D1 is equivalent to twenty-five times the predetermined delay amount along the time axis, the data/pattern decoder 118 converts the logical values corresponding to the data D1 into the three bits {D1-1, D1-2, D1-3} of the data D1, since the integer that is most close to the remainder obtained from dividing twenty-five by eight is three. Similarly, the data/pattern decoder 118 can convert the logical values corresponding to the data D2, D3, and D4 into the three bits {D2-1, D2-2, D2-3} of the data D2, the two bits {D3-1, D3-2} of the data D3, and the one bit {D4-1} of the data D4, respectively. As a result, the data/pattern decoder 118 converts the logical values into the recovered data Data_Out according to the unit bit length.

Figure 4A:
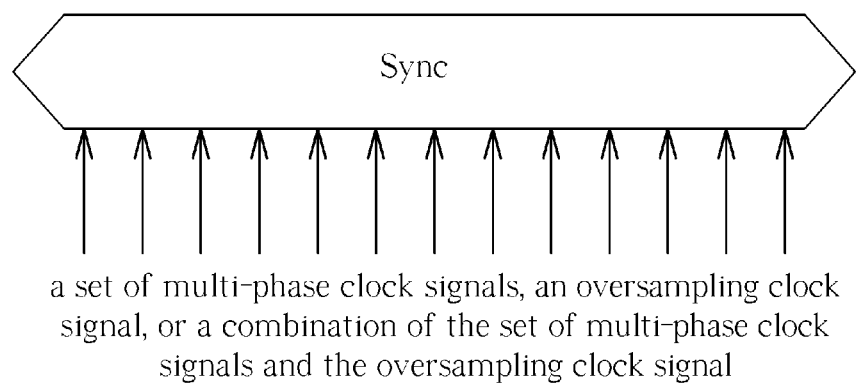
FIGS. 4A-4B illustrate some implementation details of the clock regeneration method shown in FIG. 2 according to different embodiments of the present invention.
Figure 4B:
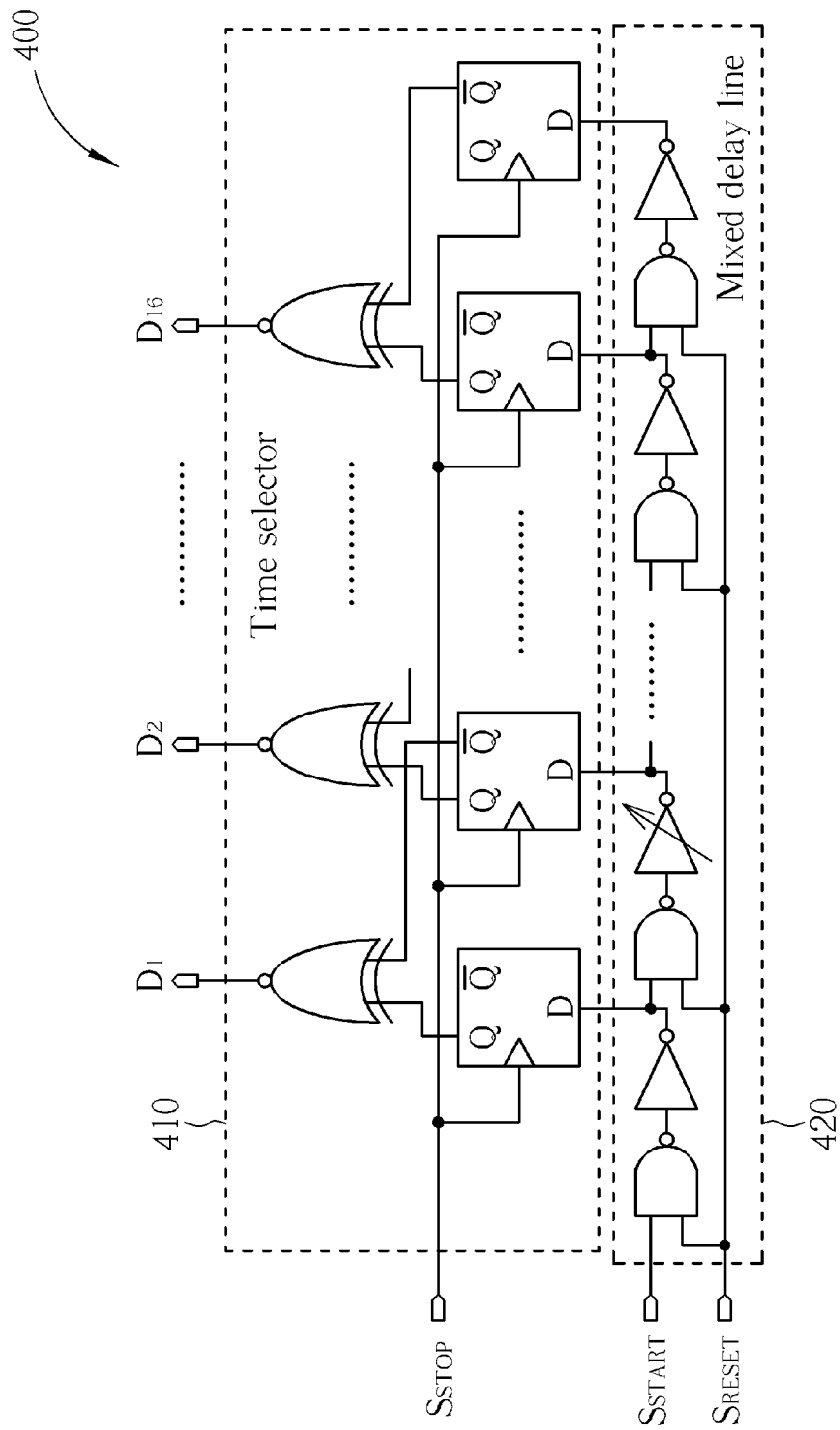

FIGS. 4A-4B illustrate some implementation details of the operations disclosed in Step 910 of the clock regeneration method 900 shown in FIG. 2 according to different embodiments of the present invention.

According to the embodiment shown in FIG. 4A, the digitalization circuit 112 performs the digitalization operations on the aforementioned at least one input signal Data_In according to a set of multi-phase clock signals, an oversampling clock signal, or a combination of the set of multi-phase clock signals and the oversampling clock signal, where the interval between any two adjacent arrows shown in FIG. 4A along the time axis represents the predetermined delay amount. In practice, the digitalization circuit 112 can utilize at least one set of delay units to generate the set of multi-phase clock signals and/or the oversampling clock signal. For example, the predetermined delay amount is equivalent to a delay amount of a delay unit. In another example, the predetermined delay amount is equivalent to a delay amount of a certain predetermined number of delay units.

According to the embodiment shown in FIG. 4B, the digitalization circuit 112 comprises a Time-to-Digital Converter (TDC) 400, where the TDC 400 comprises a time selector 410 and a mixed delay line 420. The TDC 400 is arranged to perform time-to-digital conversion on the aforementioned at least one input signal Data_In, in order to perform the digitalization operations. More particularly, the TDC 400 can measure the time interval between two edges of at least one target signal. For example, a preprocessing unit within the digitalization circuit 112 can utilize two rising edges of the target signal (e.g. a portion of the input signal Data_In) to respectively trigger the start signal $S_{START}$ and the end signal $S_{STOP}$, and therefore, the start signal SsTART rises to a high level at the time point of the first rising edge and the end signal $S_{STOP}$ rises to a high level at the time point of the second rising edge. As a result, the digitalization circuit 112 utilizes the time selector 410 and the mixed delay line 420 to convert the time interval between the two rising edges into the digital code $\{D_1, D_2, \ldots, D_{16}\}$. Typically, the logical value of a certain digit of the digital code $\{D_1, D_2, \ldots, D_{16}\}$, such as the digit $D_X$ (where X represents a certain positive integer in the range of [1, 16]), is equivalent to one, while each of the logical values of the other digits is equivalent to zero. As the magnitude of X corresponds to the length of the time interval, the digital code $\{D_1, D_2, \ldots, D_{16}\}$ may represent the time interval that is detected. Please note that, the digitalization circuit 112 can utilize the reset signal $S_{RESET}$ to reset the mixed delay line 420, in order to re-perform the measurement operations disclosed above.

FIGS. 5A-5E illustrate some implementation details of the frequency-locking device 130 shown in FIG. 1E according to different embodiments of the present invention.

Figure 5A:
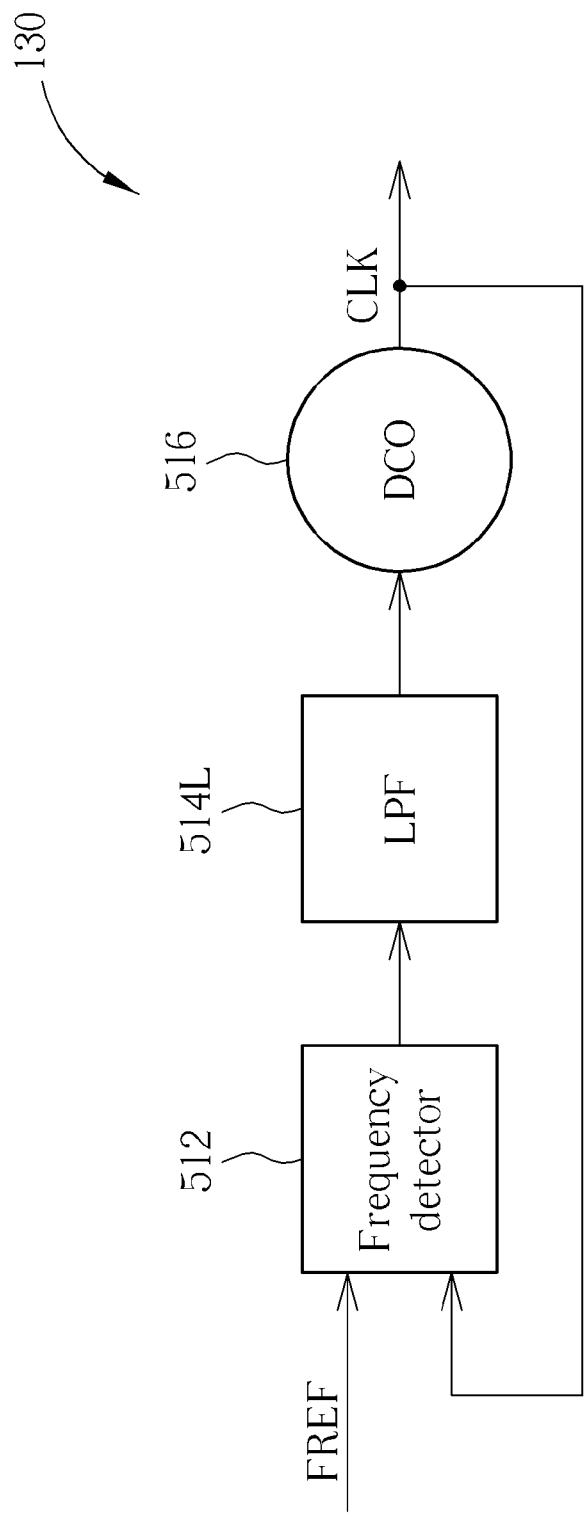
FIGS. 5A-5E illustrate some implementation details of the frequency-locking device shown in FIG. 1E according to different embodiments of the present invention.

According to the embodiment shown in FIG. 5A, the frequency-locking device 130 comprises the frequency detector 512, the low pass filter (LPF) 514L, and the DCO 516, where the frequency-locking device 130 utilizes the output of the DCO 516 as the clock signal CLK. The frequency detector 512 detects the frequency difference between the clock signal CLK and the synchronization signal FREF, and outputs the corresponding frequency difference signal, and the LPF 514L performs low pass filtering on the frequency difference signal to generate the input of the DCO 516. As a result, the frequency-locking device 130 locks the frequency of the clock signal CLK onto the frequency of the synchronization signal FREF.

Figure 5B:
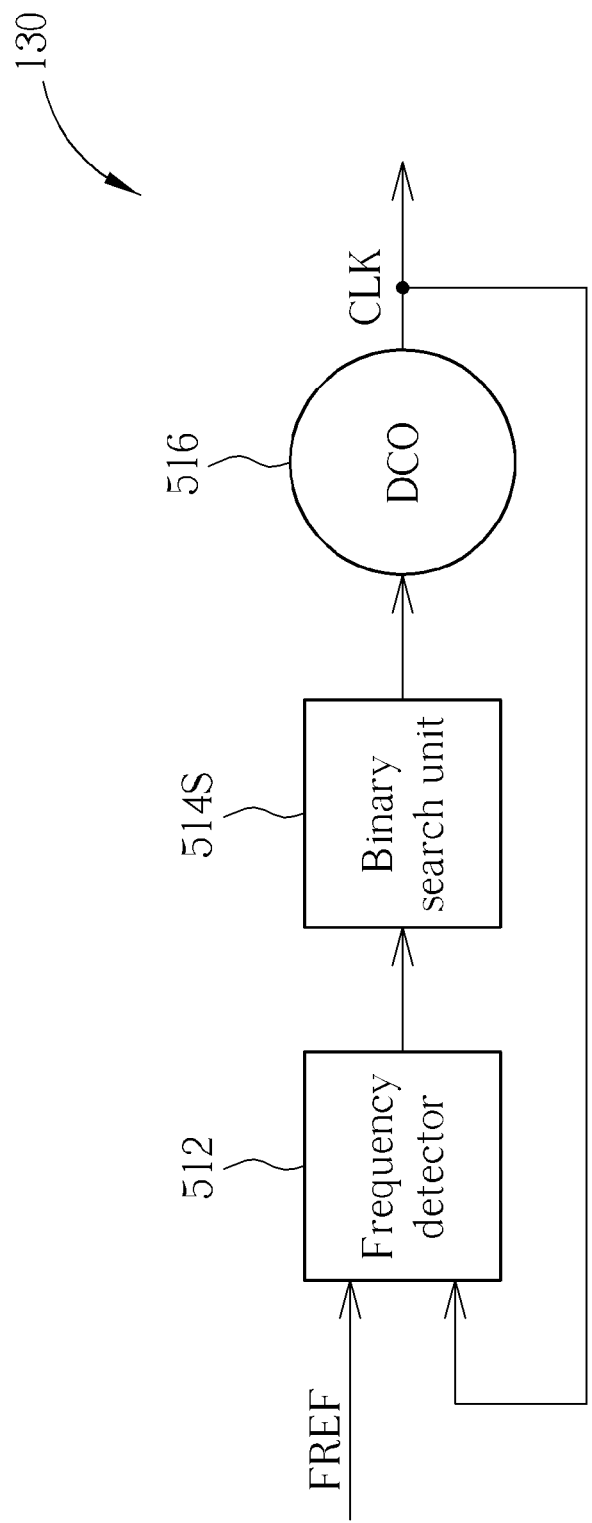

According to the embodiment shown in FIG. 5B, the frequency-locking device 130 comprises the frequency detector 512, the binary search unit 514S, and the DCO 516, where the binary search unit 514S can be implemented by utilizing a Successive Approximation Register (SAR) or other component(s). This embodiment is a variation of the embodiment shown in FIG. 5A. The binary search unit 514S can perform binary search on the frequency difference signal to generate the input of the DCO 516. Similar descriptions are not repeated for this embodiment.

Figure 5C:
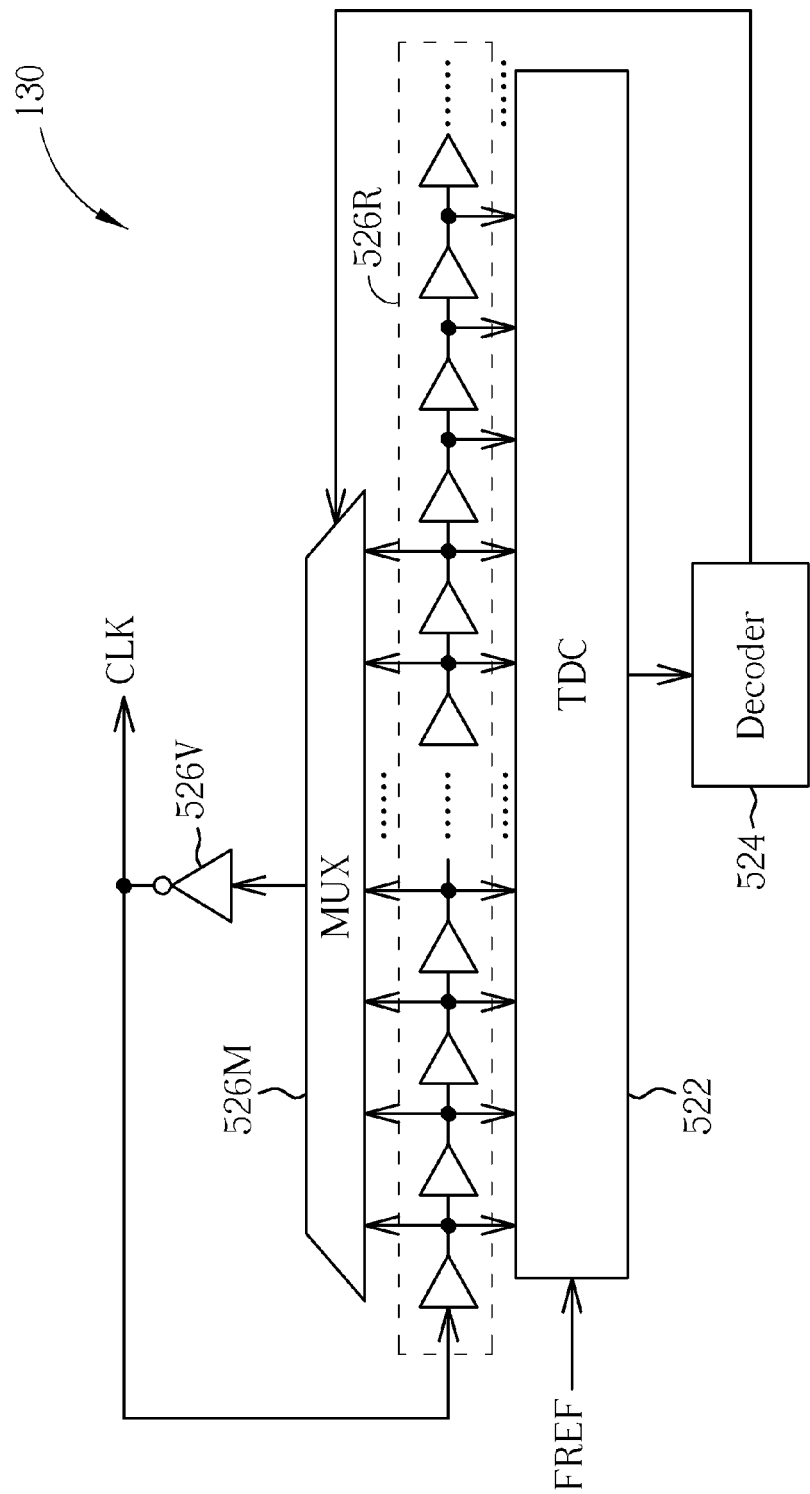

According to the embodiment shown in FIG. 5C, the frequency-locking device 130 comprises the TDC 522, the decoder 524, the multiplexer 526M (labeled "MUX"), the buffering stages 526R, and the inverter 526V, where the frequency-locking device 130 is equipped with at least one ring-based oscillator, which comprises at least one portion of the buffering stages 526R, the multiplexer 526M, and the inverter 526V. The frequency-locking device 130 utilizes the TDC 522 to perform time-to-digital conversion on the synchronization signal FREF according to the output of the buffering stages 526R, in order to generate at least one digital code, and the decoder 524 decodes the digital code to generate a selection signal, and the multiplexer 526M multiplexes the output paths of the buffering stages of the aforementioned at least one ring-based oscillator according to the selection signal, in order to dynamically adjust a frequency of the clock signal CLK. Similar descriptions are not repeated for this embodiment.

According to a variation of this embodiment, at least one capacitor can be installed at a certain position within the ring-based oscillator, such as the leftmost input terminal of the buffering stages 526R, in order to tune the frequency of the clock signal CLK. Similar descriptions are not repeated for this variation.

Figure 5D:
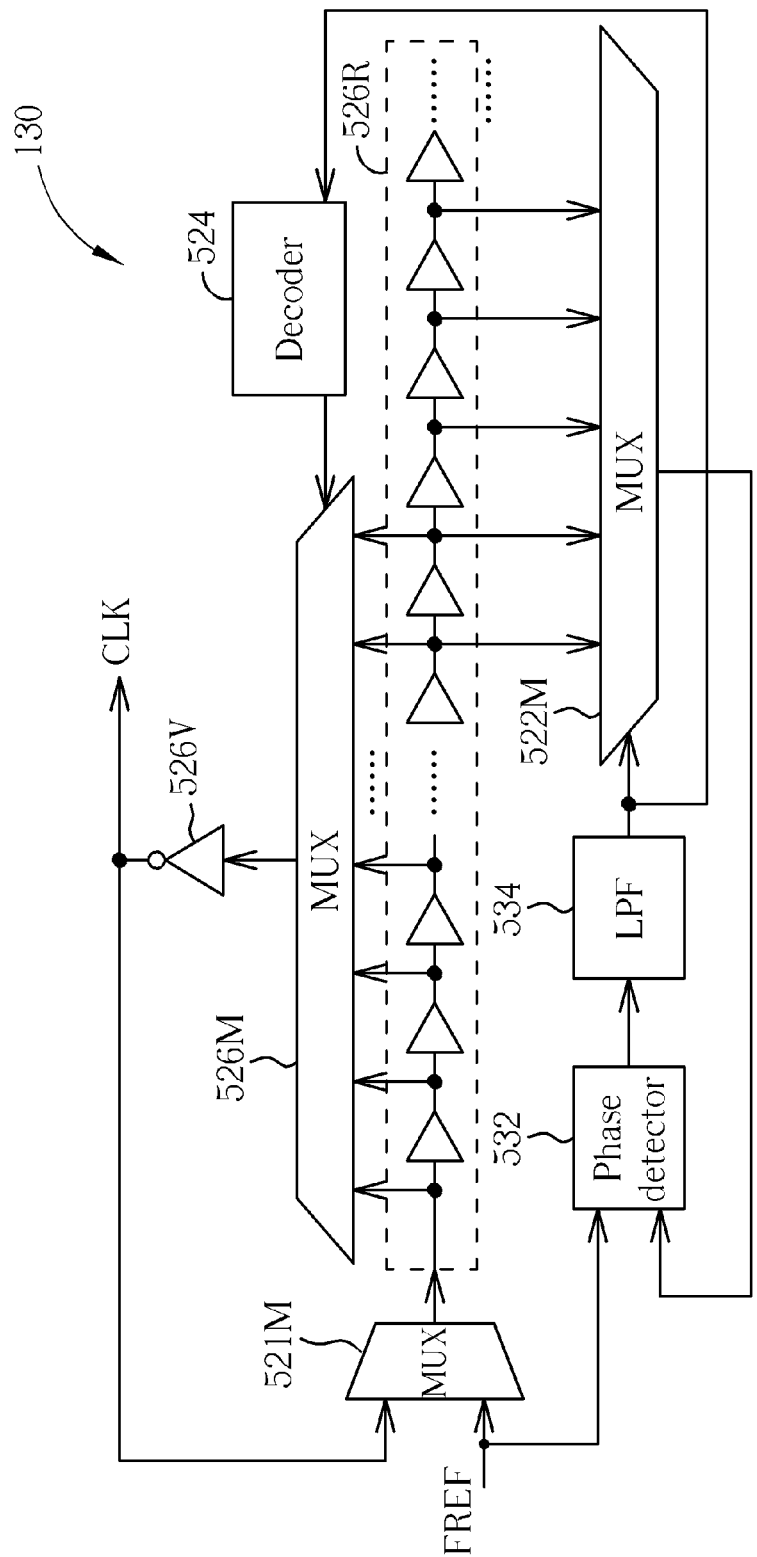

According to the embodiment shown in FIG. 5D, in addition to the decoder 524, the multiplexer 526M, the buffering stages 526R, and the inverter 526V mentioned above, the frequency-locking device 130 further comprises the multiplexers 521M and 522M (respectively labeled "MUX"), the phase detector 532, and the LPF 534, where the frequency-locking device 130 is equipped with at least one ring-based oscillator, which comprises at least one portion of the buffering stages 526R, the multiplexers 521M and 526M, and the inverter 526V. The phase detector 532 detects the phase difference between the output of the multiplexer 522M and the synchronization signal FREF, and outputs the corresponding phase difference signal, and the LPF 534 performs low pass filtering on the phase difference signal to generate the selection signal of the multiplexer 522M, causing the multiplexer 522M to multiplex the output paths of at least one portion of the buffering stages 526R. In addition, the decoder 524 decodes the selection signal generated by the LPF 534, in order to generate the selection signal of the multiplexer 526M. As a result, the frequency-locking device 130 utilizes the multiplexer 526M to multiplex the output paths of the buffering stages of the aforementioned at least one ring-based oscillator, in order to dynamically tune the frequency of the clock signal CLK. Similar descriptions are not repeated for this embodiment.

According to a variation of this embodiment, at least one capacitor can be installed at a certain position within the ring-based oscillator, such as the leftmost input terminal of the buffering stages 526R, in order to tune the frequency of the clock signal CLK. Similar descriptions are not repeated for this variation.

Figure 5E:
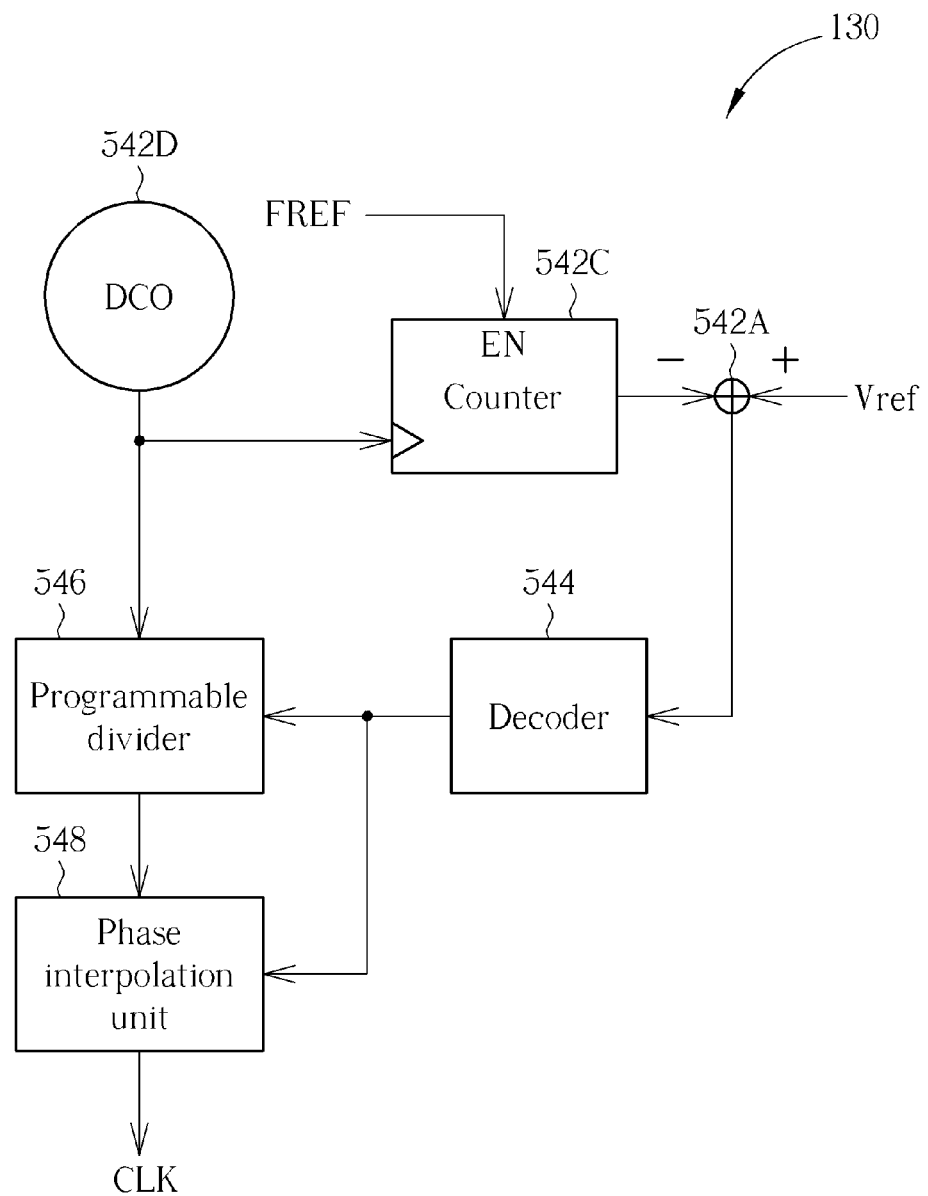

According to the embodiment shown in FIG. 5E, the frequency-locking device 130 comprises the DCO 542D, the counter 542C, the arithmetic unit 542A, the decoder 544, the programmable divider 546, and the phase interpolation unit 548, where the arithmetic unit 542A can be implemented by utilizing a subtraction unit, and the frequency of the output of the DCO 542D can be much greater than the frequency of the synchronization signal FREF. The frequency-locking device 130 utilizes the synchronization signal FREF to control the enabling terminal EN of the counter 542C, in order to selectively enable the counting operations of the counter 542C that are performed on the output of the DCO 542D. The frequency-locking device 130 utilizes the arithmetic unit 542A to compare the counting result of the counter 542C with a reference value Vref, in order to generate a comparison result, and the decoder 544 decodes the comparison result to generate a decoded result. In addition, the programmable divider 546 performs frequency division on the same output of the DCO 542D according to the decoded result, in order to generate a frequency division result, where the parameters of the programmable divider 546 of this embodiment can be adjusted, in order to tune the frequency division result. Additionally, the frequency-locking device 130 can utilize the phase interpolation unit 548 to tune the frequency division result, in order to generate the clock signal CLK. Similar descriptions are not repeated for this embodiment.

According to a variation of this embodiment, installing the phase interpolation unit 548 in the frequency-locking device 130 is not required, where the frequency-locking device 130 utilizes the aforementioned frequency division result as the clock signal CLK. Similar descriptions are not repeated for this variation.

According to some embodiments (e.g. some variations of the embodiment shown in FIG. 5E), the aforementioned DCO (e.g. the DCO 542D shown in FIG. 5E) can be replaced by a normal oscillator. Similar descriptions are not repeated for these embodiments.

It is an advantage of the present invention that, the clock regeneration method, the reference-less receiver, and the crystal-less system of any of the embodiments/variations disclosed above can achieve the best receiver performance without introducing the side effects mentioned above, having no need to utilize any external crystal oscillator. Even in a situation where the initial frequency error such as a frequency difference between the respective frequencies of the two ends of a transmission channel is greater than as usual, the architecture implemented according to the present invention can still properly perform receiving operations.

Those skilled in the art will readily observe that numerous modifications and alterations of the device and method may be made while retaining the teachings of the invention.

What is claimed is:

1. A clock regeneration method, for generating a clock signal for being utilized by a receiver/transceiver/receiver system/transceiver system, the clock regeneration method comprising:
    performing data/pattern detection on at least one input signal to generate recovered data, wherein the step of performing data/pattern detection on the at least one input signal to generate the recovered data further comprises:
        detecting logical values represented by the input signal at a plurality of time points, respectively, wherein a length between any two adjacent time points of the plurality of time points is equivalent to a predetermined delay amount;
        analyzing at least one portion of the logical values, in order to dynamically determine/update a unit bit length, wherein the unit bit length is a multiple that is measured by utilizing the predetermined delay amount as a measurement unit; and
        converting the logical values into the recovered data according to the unit bit length;
    detecting at least one synchronization pattern in the input signal according to a synchronization pattern rule, and generating a synchronization signal corresponding to the synchronization pattern, where the step of detecting the at least one synchronization pattern in the input signal according to the synchronization pattern rule further comprises:
        detecting the at least one synchronization pattern by performing synchronization pattern detection on the recovered data; and
    performing frequency-locking on the synchronization signal to generate the clock signal.

2. The clock regeneration method claim 1, wherein the predetermined delay amount is less than a length of any bit of data carried by the input signal along a time axis.

3. The clock regeneration method claim 2, wherein the step of performing data/pattern detection on the at least one input signal to generate the recovered data further comprises:
    performing digitalization operations on the at least one input signal according to a set of multi-phase clock signals, an oversampling clock signal, or a combination of the set of multi-phase clock signals and the oversampling clock signal.

4. The clock regeneration method claim 2, wherein the step of performing data/pattern detection on the at least one input signal to generate the recovered data further comprises:
    utilizing a Time-to-Digital Converter (TDC) to perform time-to-digital conversion on the at least one input signal, in order to perform digitalization operations.

5. The clock regeneration method claim 1, wherein the step of analyzing the at least one portion of the logical values in order to dynamically determine/update the unit bit length further comprises:
    finding a minimum of respective numbers of different sets of continuously detected non-transition logical values within the logical values, and utilizing the minimum as a latest value of the unit bit length.

6. The clock regeneration method claim 1, wherein the step of converting the logical values into the recovered data according to the unit bit length further comprises:
    within the logical values, dynamically determining a set of continuously detected logical values corresponding to a bit according to the unit bit length, and keeping a logical value of the set of continuously detected logical values as that of the bit within the recovered data.

7. The clock regeneration method claim 6, wherein the logical value is a mode of the set of continuously detected logical values.

8. The clock regeneration method claim 1, wherein the step of performing frequency-locking on the synchronization signal to generate the clock signal further comprises:
    detecting a frequency difference/phase difference between the clock signal and the synchronization signal, and dynamically adjusting a frequency of the clock signal according to the frequency difference/phase difference.

9. The clock regeneration method claim 1, wherein the step of performing frequency-locking on the synchronization signal to generate the clock signal further comprises:
    utilizing a Digitally Controlled Oscillator (DCO) to generate an initial version of the clock signal.

10. A clock regeneration method, for generating a clock signal for being utilized by a receiver/transceiver/receiver system/transceiver system, the clock regeneration method comprising:
    performing data/pattern detection on at least one input signal to generate recovered data
    detecting at least one synchronization pattern in the input signal according to a synchronization pattern rule, and generating a synchronization signal corresponding to the synchronization pattern, where the step of detecting the at least one synchronization pattern in the input signal according to the synchronization pattern rule further comprises:
        detecting the at least one synchronization pattern by performing synchronization pattern detection on the recovered data and
    performing frequency-locking on the synchronization signal to generate the clock signal, wherein the step of performing frequency-locking on the synchronization signal to generate the clock signal further comprises:
        utilizing a Time-to-Digital Converter (TDC) to perform time-to-digital conversion on the synchronization signal, in order to generate at least one digital code;
        decoding the digital code to generate a selection signal; and
        multiplexing output paths of buffering stages of a ring-based oscillator according to the selection signal, in order to dynamically adjust a frequency of the clock signal.

11. A reference-less receiver, for performing data/pattern detection on at least one input signal to generate recovered data, the reference-less receiver comprising:
    a digitalization circuit arranged to perform digitalization operations on the input signal, in order to detect logical values represented by the input signal at a plurality of time points, respectively, wherein a length between any two adjacent time points of the plurality of time points is equivalent to a predetermined delay amount;

a bit transition detection unit arranged to perform bit transition detection operations according to the logical values, in order to generate bit transition detection results;

a unit-time detection unit arranged to analyze at least one portion of the logical values by utilizing the bit transition detection results, in order to dynamically determine/update a unit bit length, wherein the unit bit length is a multiple that is measured by utilizing the predetermined delay amount as a measurement unit; and a data/pattern decoder arranged to convert the logical values into the recovered data according to the unit bit length.

12. The reference-less receiver of claim 11, wherein the predetermined delay amount is less than a length of any bit of data carried by the input signal along a time axis.

13. The reference-less receiver of claim 12, wherein the digitalization circuit performs digitalization operations on the at least one input signal according to a set of multi-phase clock signals, an oversampling clock signal, or a combination of the set of multi-phase clock signals and the oversampling clock signal.

14. The reference-less receiver of claim 12, wherein the digitalization circuit comprises:

a Time-to-Digital Converter (TDC) arranged to perform time-to-digital conversion on the at least one input signal, in order to perform the digitalization operations.

15. The reference-less receiver of claim 11, wherein the unit-time detection unit finds a minimum of respective numbers of different sets of continuously detected non-transition logical values within the logical values, and utilizes the minimum as a latest value of the unit bit length.

16. The reference-less receiver of claim 11, wherein within the logical values, the data/pattern decoder dynamically determines a set of continuously detected logical values corresponding to a bit according to the unit bit length, and keeps a logical value of the set of continuously detected logical values as that of the bit within the recovered data.

17. A crystal-less system, for generating a clock signal for being utilized by a receiver/transceiver/receiver system/transceiver system, the crystal-less system comprising:

a data/pattern detection module arranged to perform data/pattern detection on at least one input signal to generate recovered data, wherein the data/pattern detection module comprises:

a digitalization circuit arranged to perform digitalization operations on the input signal, in order to detect logical values represented by the input signal at a plurality of time points, respectively, wherein a length between any two adjacent time points of the plurality of time points is equivalent to a predetermined delay amount;

a bit transition detection unit arranged to perform bit transition detection operations according to the logical values, in order to generate bit transition detection results;

a unit-time detection unit arranged to analyze at least one portion of the logical values by utilizing the bit transition detection results, in order to dynamically determine/update a unit bit length, wherein the unit bit length is a multiple that is measured by utilizing the predetermined delay amount as a measurement unit; and a data/pattern decoder arranged to convert the logical values into the recovered data according to the unit bit length;

a synchronization pattern detection module arranged to detect at least one synchronization pattern in the input signal according to a synchronization pattern rule, and generate a synchronization signal corresponding to the synchronization pattern, wherein the synchronization pattern detection module detects the at least one synchronization pattern by performing synchronization pattern detection on the recovered data; and a frequency-locking device arranged to perform frequency-locking on the synchronization signal to generate the clock signal, wherein the frequency-locking device comprises at least one hardware circuit.

18. The crystal-less system of claim 17, wherein the predetermined delay amount is less than a length of any bit of data carried by the input signal along a time axis.

* * * * *